United States Patent [19]

Dansky et al.

[11] Patent Number: 5,287,016
[45] Date of Patent: Feb. 15, 1994

[54] HIGH-SPEED BIPOLAR-FIELD EFFECT TRANSISTOR (BI-FET) CIRCUIT

[75] Inventors: Allan H. Dansky; John F. McCabe, both of Poughkeepsie, N.Y.; Kenny K. Shin, Austin, Tex.

[73] Assignee: International Business Machines Corporation, Armonk, N.Y.

[21] Appl. No.: 861,755

[22] Filed: Apr. 1, 1992

[51] Int. Cl.5 ............................................. H03K 19/08
[52] U.S. Cl. ..................................... 307/446; 307/455; 307/443; 307/272.2
[58] Field of Search ............... 307/494, 495, 446, 455, 307/272.2, 570, 443

[56] References Cited

U.S. PATENT DOCUMENTS

| | | | |
|---|---|---|---|
| 3,885,169 | 5/1975 | Heightley | 307/272.2 |
| 4,590,438 | 5/1986 | Fukushima et al. | 330/300 |
| 4,617,475 | 10/1986 | Reinschmidt | 307/455 |
| 4,658,159 | 4/1987 | Miyamoto | 330/300 |
| 4,725,979 | 2/1988 | Hoberman | 307/455 |
| 4,926,071 | 5/1990 | MacMillan et al. | 307/448 |
| 4,963,767 | 10/1990 | Sinh | 307/455 |
| 5,027,005 | 6/1991 | Kitsuta et al. | 307/455 |
| 5,124,589 | 6/1992 | Shiomi et al. | 307/272.2 |
| 5,134,312 | 7/1992 | Jones, Jr. et al. | 307/272.2 |
| 5,170,079 | 12/1992 | Komatsu et al. | 307/494 |

FOREIGN PATENT DOCUMENTS 2-137418  5/1990  Japan .................................. 307/455

Primary Examiner—Edward P. Westin
Assistant Examiner—Jon Santamauro
Attorney, Agent, or Firm—Irwin Ostroff

[57] ABSTRACT

A process and hold system includes a bipolar logic section which is clocked on and off by a first field effect transistor and a bipolar latch section which is clocked on and off by a second field effect transistor. Emitter coupled logic is used in both the logic and latch sections in order to obtain high speed operation. Each of the field effect transistors is used as an on-off switches which has low impedance between the drain and source thereof when enabled and conducting. Outputs of the logic section are coupled to inputs of the latch section. Complementary clock signals are used to control the first and second field effect transistors so that one of the logic and latch section is enabled at a time. The logic section uses a two level emitter coupled tree configuration in order to increase logic capability. The use of the field effect transistors facilitates the use of a power supply having a voltage level of +3.6 volts. This is contrasted with the typical +5 volt supply used with conventional emitter coupled tree configurations. Accordingly, high speed at reduced power dissipation is achieved using the inventive process and hold system.

12 Claims, 2 Drawing Sheets

HIGH-SPEED BIPOLAR-FIELD EFFECT TRANSISTOR (BI-FET) CIRCUIT

FIELD OF THE INVENTION

This invention relates to high speed circuitry, and, more particularly, to high speed multilevel integrated circuits which use bipolar and field effect transistors and are typically denoted as BI-FET circuits.

BACKGROUND OF THE INVENTION

Since at least the 1960's bipolar transistors have been used for high speed integrated circuits such as in emitter coupled logic (ECL) circuits. A typical (basic) emitter coupled logic circuit consists of a pair of n-p-n transistors with the collectors coupled to separate first and second load resistors and the emitters coupled to a resistor or to the collector of a third n-p-n transistor whose emitter is coupled to a third resistor. Such a circuit can exhibit rise and fall times in the pico-second range. One problem with this circuit is that power dissipation is higher than is desired in some applications. One partial solution to the power dissipation problem is to stack emitter coupled pairs of n-p-n transistors on top of each other to form a tree type configuration. It is known to have two levels of emitter coupled pairs of transistors with an n-p-n transistor coupled by the collector thereof to the emitters of one of the levels. This substantially increases the amount of logic which can be used while maintaining speed and power at the same level as is used with a single pair of emitter coupled transistors. Thus the speed/power product of the resulting tree configuration is significantly improved as compared to the basic emitter coupled configuration.

One limitation on the tree configuration of emitter coupled logic circuits is that in order to operate at very high speeds, the transistors must be operated out of saturation in what is known as the linear range of operation. This requires that the voltage across the collector-emitter regions of the transistors of each level be about one volt. Typical output voltage signal levels of emitter coupled circuits have magnitude of about 0.7 volts. In addition, voltage across the constant current source which comprises the third transistor and the third resistor is typically about 2 volts or more. Accordingly, a power supply voltage of about 5 volts is needed for proper operation. The supply voltage can not be lowered much because of the need to keep the transistors out of saturation so as to insure very high speed operation. Accordingly, power dissipation is still higher than is desired in some applications.

BI-FETS use a combination of field effect and bipolar transistors. The field effect transistor's high input impedance characteristic makes it useful as an input device. The low output impedance of the bipolar transistor makes it useful as an output device.

SRAMs exist which use a mixture of bipolar and field effect transistors. A bipolar-CMOS static random access memory which includes a sense amplifier having a pair of emitter coupled n-p-n transistors and a field effect transistor (FET) is disclosed in U.S. Pat. No. 4,825,413 (H. V. Tran). The emitters of the transistors are coupled to the drain of the FET whose source is connected to a reference potential. The FET is described as being turned on to provide a current path for the transistors. Variations in the characteristics of the FET, such as gate oxide thickness, and in the voltage level applied to the gate thereof can cause variations in the current flow through the FET. This makes this type of configuration less than ideal for use in applications in which a constant current source is desired.

Some logic applications which require constant current sources use a multi-level tree type configuration which requires multiple logic and voltage levels as inputs. The above described configuration of U.S. Pat. No. 4,825,413 is not useful in these applications.

In applications such as logic circuits, which are standardized and are known as master slice or library circuits, typically only standard logic levels are used and it becomes a problem to use multiple different voltage logic levels typically required by bipolar and field effect transistors.

It is desirable to have ECL type logic circuits which have very high speed operation with lower power dissipation than conventional ECL circuits.

SUMMARY OF THE INVENTION

The present invention is directed to a process and hold system which comprises a bipolar logic section which is clocked on and off by a first field effect transistor and a bipolar latch section which is clocked on and off by a second field effect transistor. Emitter coupled logic is used in both the logic and latch sections in order to obtain high speed operation. Each of the field effect transistors is used as an on-off switch which has low impedance between the drain and source thereof when enabled and conducting. Outputs of the logic section are coupled to inputs of the latch section. Complementary clock signals are used to control the first and second field effect transistors so that only one of the logic and latch section is enabled at time. The logic section uses a two level emitter coupled tree configuration in order to increase logic capability. The use of the field effect transistors facilitates the use of a power supply having a voltage level of +3.6 volts. This is contrasted with the typical +5 volt supply used with conventional emitter coupled tree configurations. Accordingly, high speed at reduced power dissipation is achieved using the inventive process and hold system.

Viewed from one aspect, the present invention is related to a combination comprising a logic section, a latch section, first and second field effect transistors and a first resistive element. The logic section comprises bipolar transistors. The first and second field effect transistors each have a gate and first and second outputs. The first output of the field effect transistor is coupled to at least one of the bipolar transistors. The first field effect transistor is adapted to selectively enable the logic section so as to allow current flow through at least one of the bipolar transistors of the logic section and is adapted to selectively disable the logic section so as to cut off current flow through the transistors of the logic section. The latch section comprises bipolar transistors. The first output of the second field effect transistor is coupled to at least one of the bipolar transistors of the logic section. The second field effect transistor is adapted to selectively disable the latch section while the logic section is enabled and to enable conduction through at least one of the bipolar transistors of the latch section when the logic section is disabled. An output of the logic section is coupled to an input of the latch section. The second outputs of the first and second field effect transistors are coupled to the first resistive element.

Viewed from another aspect, the present invention is directed to circuitry comprising first, second, and third pairs of emitter coupled bipolar transistors and a field effect transistor, and first, second, and third resistive elements. Each of the bipolar transistors has a base, an emitter and a collector, and the field effect transistor has a gate and first and second outputs. The emitters of the first pair of transistors are coupled to the collector of the first transistor of the third pair of transistors. The emitters of the second pair of transistors are coupled to the collector of the second transistor of the third pair of transistors. The emitters of the third pair of transistors are coupled to the first output of the field effect transistor. The bases of first transistors of the first and second pairs of transistors are coupled to first and second input data terminals, respectively, of the circuitry. The bases of the first and second transistors of the third pair of transistors are coupled to first and second input selection terminals, respectively, of the circuitry. The gate of the field effect transistor is coupled to a clock terminal of the circuitry. The collectors of the first transistors of the first and second pairs of transistors are coupled to a first output terminal of the circuitry. The collectors of the second transistors of the first and second pairs of transistors are coupled to a second output terminal of the circuitry. The collectors of the first transistors of the first and second pairs of transistors are coupled to the first and second resistive elements, respectively. The second output of the field effect transistor is coupled to the third resistive element.

The invention will be better understood from the following more detailed description taken with the accompanying drawing and claims.

DETAILED DESCRIPTION

Figure 1:
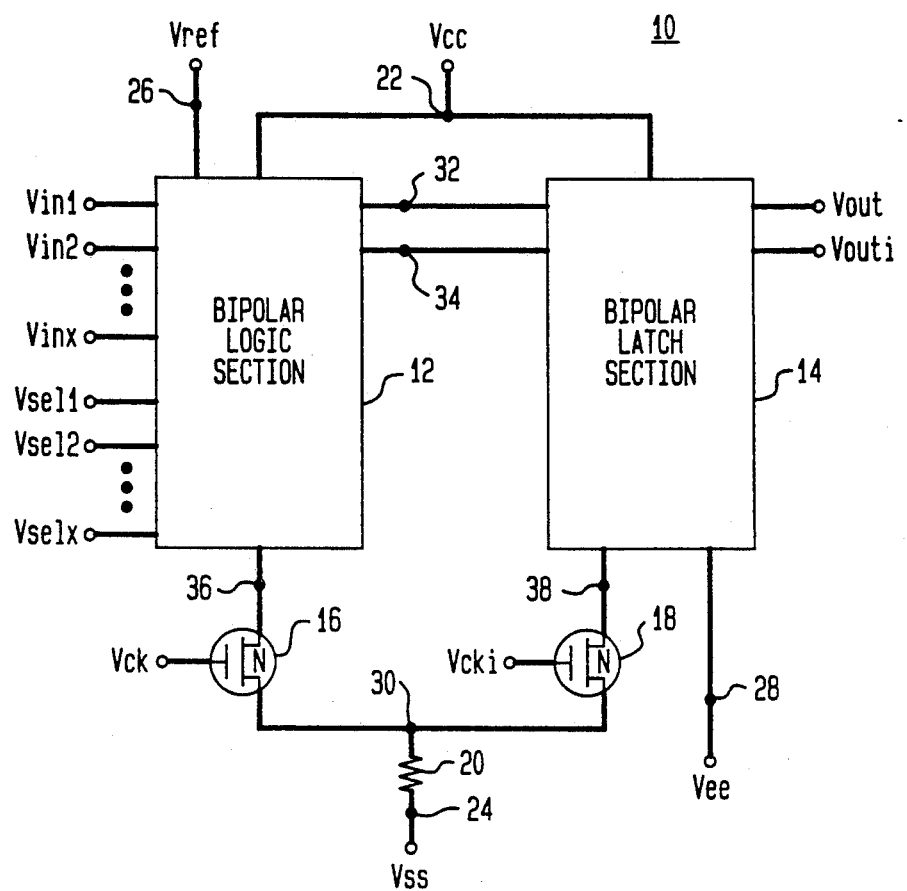
FIG. 1 shows a process and hold system in accordance with the present invention.

Referring now to FIG. 1, there is shown a process and hold logic system (circuitry) lo in accordance with the present invention. System 10 comprises a bipolar logic section 12, a bipolar latch section 14, n-channel field effect transistors 16 and 18 and a resistor (resistive element) 20. Input terminals Vin1, Vin2 ... Vinx of the bipolar logic section 12 are adapted to receive data input signals which are to be processed by bipolar logic section 12. Input terminals Vsell, Vse12 ... Vselx of the bipolar logic sections 12 are adapted to receive selection input signals which determine which one of the Vin1, Vin2, ... Vinx input data signals is to be processed by bipolar logic section 12 at a given time. Outputs of bipolar logic section 12 are coupled to inputs of bipolar latch section 14 and to terminals 32 and 34, respectively. Outputs Vout and Vouti (the inverse of Vout) of bipolar latch section 14 serve as the outputs of system 10. Complementary clock signals Vck and Vcki are coupled to the gates of transistors 16 and 18, respectively, When transistor 16 is enabled (turned "ON") by a high signal, a "1", on the gate thereof, bipolar logic section 12 can process signals received at one of input terminals Vin1, Vin2 ... Vinx and generates an output signal on terminals 32 and 34 thereof. When transistor 16 is enabled, transistor 18 is disabled (turned "OFF") by a low signal, a "0", on the gate thereof and bipolar latch section 14 is disabled. When Vck and Vcki switch from a "1" and a "0", respectively, to a "0" and a "1", bipolar logic section 12 becomes disabled and bipolar latch section 14 becomes enabled and latches up so as to generate and hold a signal at the output Vout which is of the same logic level as was applied to the selected one of input data terminals Vin1, Vin2 ... Vinx.

Transistor 16 has a drain which is coupled to bipolar logic section 12 and to terminal 36. Transistor 18 has a drain which is coupled to bipolar latch section 14 and to a terminal 38. Sources of transistors 16 and 18 are coupled to a first terminal of resistor 20 and to a terminal 30.

Bipolar logic section 12 and bipolar latch section 14 are both coupled to terminal 22 to which is applied a positive power supply having a voltage Vcc. A second terminal of resistor 20 is coupled to a terminal 24 and to a first reference power supply having a voltage Vss. Bipolar logic section 12 is also coupled to a terminal 26 and to a reference power supply having a voltage Vref. Bipolar latch section 14 is also coupled to a terminal 28 and to a positive power supply having a voltage Vee.

Figure 2:
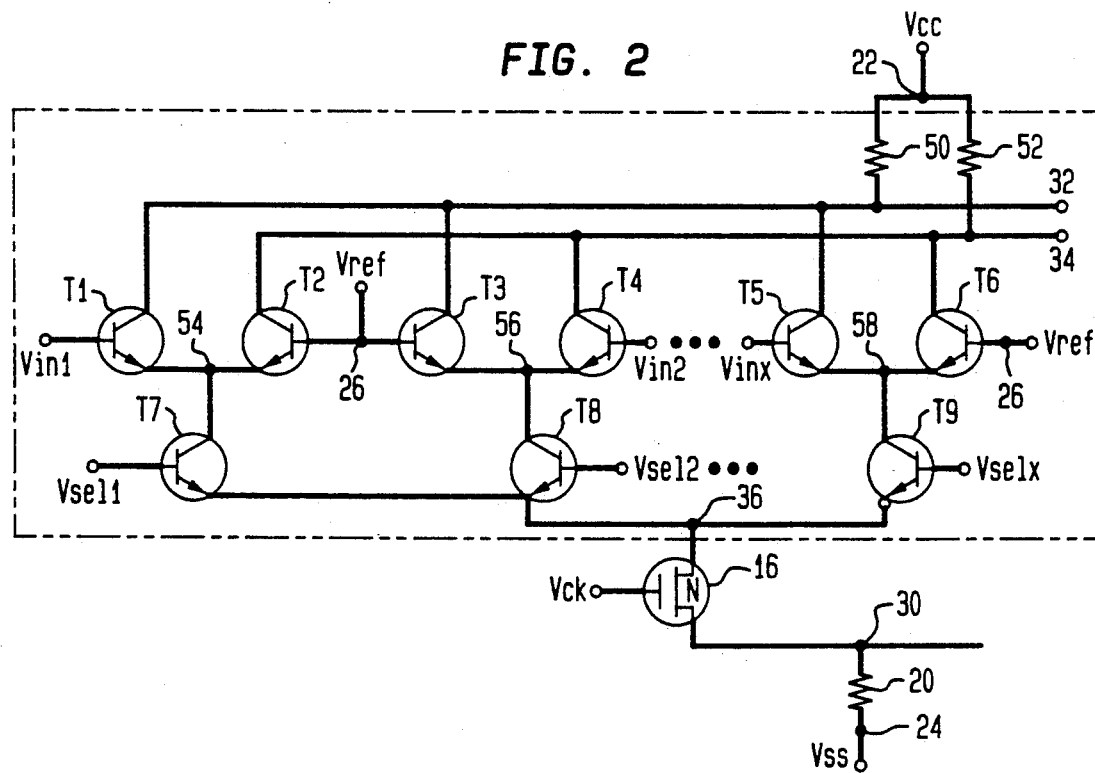
FIG. 2 shows a preferred embodiment of a portion of the process and hold system of FIG. 1.

Referring now to FIG. 2, there is shown within a dashed line rectangle 12 a preferred embodiment of bipolar logic section 12 of FIG. 1 and transistor 16 and resistor 20 of FIG. 1.

The preferred embodiment of bipolar logic circuit 12 comprises a first pair of emitter coupled n-p-n transistors T1 and T2, a second pair of emitter coupled n-p-n transistors T3 and T4, a third pair of emitter coupled n-p-n transistors T5 and T6, n-p-n transistors T7, T8 and T9, and resistors (resistive elements) 50 and 52.

The collectors of T1, T4 and T5 are coupled to a first terminal of resistor 50 and to the terminal 32. The collectors of T2, T3 and T6 are coupled to a first terminal of the resistor 52 and to the terminal 34. Second terminals of resistor 50 and 52 are coupled to a terminal 22 and to Vcc. The emitters of T1 and T2 are coupled to the collector of T7 and to a terminal 54. The emitters of T3 and T4 are coupled to the collector of T8 and to a terminal 56. The emitters of T5 and T6 are coupled to the collector of T9 and to a terminal 58. The emitters of T7, T8 and T9 are all coupled to the drain of transistor 16 and to the terminal 36. The bases of T1, T4 and T5 are coupled to Vin1, Vin2 and Vinx, respectively. The bases of T2, T3 and T6 are coupled to terminal 26 and to Vref. The bases of T7, T8 and T9 are coupled to Vsell, Vse12 and Vselx, respectively.

In an illustrative embodiment, Vcc= +3.6 volts, Vref= +2.35 volts, Vss=0 volts, a "1" level for Vin1, Vin2 ... Vinx= +2.6 volts, a "0" level for Vin1, Vin2 ... Vinx= +2.1 volts, a "1" level for Vsell, Vse12 ... Vselx= +1.75 volts, a "0" level for Vsell, Vse12 ... Vselx= +1.45 volts, a "1" level for Vck= +3.0 volts and a "0" level for Vck=0 volts, and resistors 50, 52 and 20 are 1140 ohms, 1140 ohms, and 2130 ohms, respectively. Using these values resulted in a measured stage delay of between 62 and 73 pico-seconds.

Bipolar logic section 12 is enabled when Vck is a "1" and is disabled when Vck is a "0". Transistor 16 is a switch which acts as a low impedance short between terminals 36 and 30 when transistor 16 is enabled by a "1" applied to the gate thereof. In an illustrative embodiment transistor 16 is a 0.8 micron n-channel enhancement insulated gate field effect transistor whose drain-to-source voltage (i.e., the voltage between terminals 34 and 30) is about 20 millivolts when bipolar logic section 12 is enabled.

Bipolar logic section 12 operates as follows. When a "1" is applied by Vck to the gate of transistor 16, bipolar logic section 12 is enabled and current flows from Vcc through resistor 50 or 52 and then through one of transistors T1, T2, T3, T4, T5 or T6, then through one of transistors T7, T8 and T9, and then through transistor 16 and resistor 20 to Vss. The actual path this current takes is determined by the logic levels of applied to the bases of T1, T4, and T6, and T7, T8 and T9. Only one of the bases of T7, T8 and T9 receive a "0". The transistor whose base receives the "1" is the transistor which allows the current from Vcc to pass therethrough. Assume that Vck="1", Vsell="1", Vsel2 . . . Vselx="0", and that Vin1="1". Under these conditions current of lows from Vcc through resistor 50, T1, T7, transistor 16, resistor 20 and into Vss. The resulting voltage drop across resistor 50 causes the output voltage of terminal 32 to be a "0". The lack of current flow through resistor 52 leaves terminal 34 at Vcc, a "1".

Assume now that Vck="1", Vsell=Vselx="0", Vsel2="1", and that Vin2="0". Under these conditions current flows from Vcc through resistor 52, T3, T8, transistor 16, resistor 20 and to Vss. The resulting voltage drop across resistor 52 causes the output voltage of terminal 34 to be a "0". The lack of current flow through resistor 50 leaves terminal 34 at Vcc, a "1".

Assume now that Vck="1", Vsell=Vsel2="0", Vselx="1", and that Vinx="1". Under these conditions current flows from Vcc through resistor 50, T5, T9, transistor 16, resistor 20 and into Vss. The resulting voltage drop across resistor 50 causes the output voltage at terminal 32 to be a "0". The lack of current flow through resistor 52 leaves terminal 32 at Vcc, a "1".

It is to be noted that with transistor 16 switched "ON" (enabled) that there is a relatively constant current flow through logic section 12. This is because the high level applied to one of Vsell, Vsel2 or Vselx is same and the emitter-base voltages of T7, T8 and T9 are the same. Thus while one of T7, T8 or T9 is "ON", the voltage at terminal 36, which is the emitter-base of one of T7, T8 or T9 below the high voltage level, is constant. This voltage divided by the on resistance of transistor 16 plus the resistance of resistor 20 determines the current flow through logic section 12.

When it is desired to transfer output signals on terminals 32 and 34 to bipolar latch section 14 of FIG. 2, Vck is switched to a "0" and Vcki (shown in FIG. 1) is switched from a "0" to a "1". This disables bipolar logic section 12 and enables bipolar latch section 14.

Once field effect transistor 16 is enabled and conducts, the switching speed of bipolar logic section 12 is determined by the response time of the emitter-coupled transistors T1 through T9 which is typically in the pico-second range. The voltage logic levels used to control T1–T9 are the normal emitter coupled logic levels used in a conventional tree configuration. The field effect voltage logic levels need only be used at the beginning and end of the cycle of operation of bipolar logic section 12. Even though field effect transistor 12 is inherently a slower responding transistor than bipolar transistors T1-T9, the switching speed of section 12 is consistent with the response time T1-T9 and is not limited by the switching time of field effect transistor 16.

The fact that the drain-to-source voltage of transistor 16 can be a few tens of millivolts (e.g., 20 millivolts allows the magnitude of Vcc to be at +3.6 volts (as compared to +5 volts which is used with a conventional emitter-coupled tree configuration) while still allowing the same logic levels at the inputs of the bipolar transistors and while still achieving pico-second response time. This lowers power dissipation by about 39% when one considers that it requires 1.4 volts more on a base of 3.6 volts to use the conventional emitter coupled tree configuration as compared to application's bipolar logic section of FIGS. 1 and 2.

Figure 3:
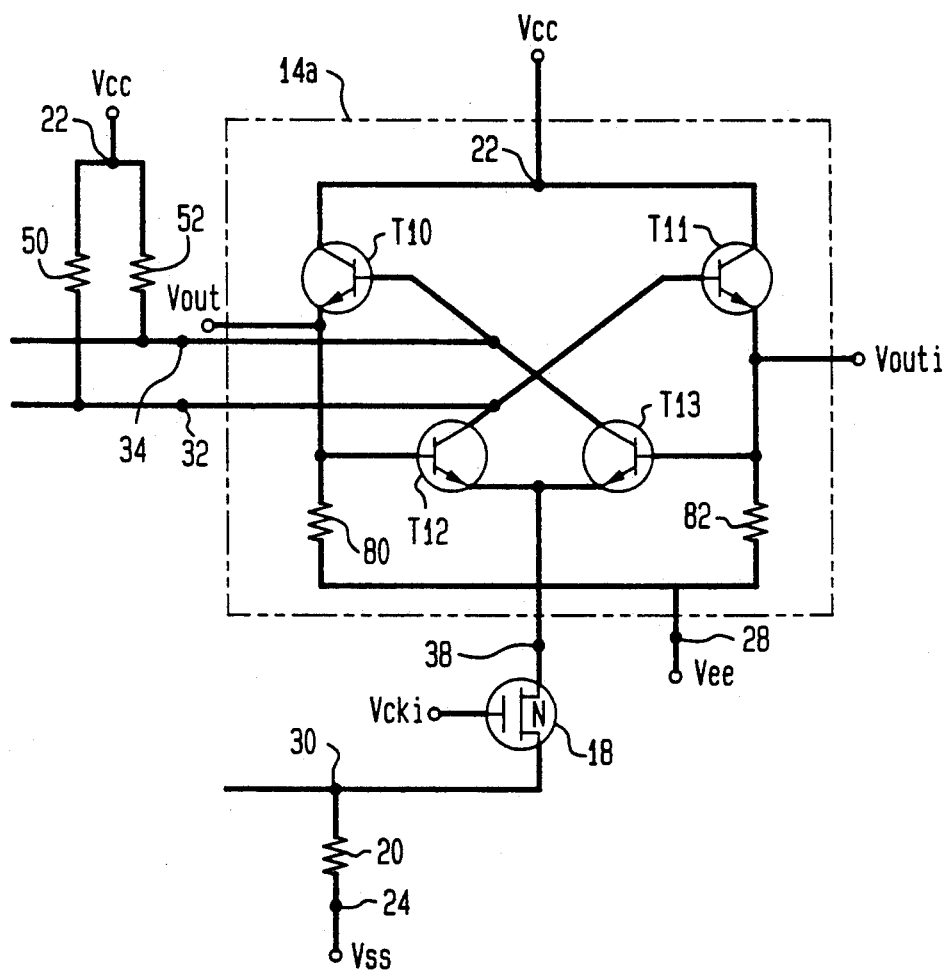
FIG. 3 shows a preferred embodiment of another portion of the process and hold system of FIG. 1.

Referring now to FIG. 3, there is shown within a dashed line rectangle 14a a preferred embodiment of the bipolar latch section 14 of FIG. 1. The preferred embodiment of section 14 comprises n-p-n transistors T10, T11, T12 and T13, and resistors (resistive elements) 80 and 82. Resistors 20, 50 and 52 from FIG. 2 are repeated here. They are necessary for the operation of the preferred embodiment 14a of latch section 14 but may be shared with logic section 12. The collectors of T10 and T11 are coupled to terminal 22 and to Vcc. First terminals of resistors 80 and 82 are coupled to the terminal 28 and to the power source having the voltage Vee. When Vcki="1", transistor 18 and latch section 14 are enabled and output signals on terminals 32 and 34 from logic section 10 of FIGS. 1 and 2 cause latch section 14 to "latch - up, i.e., to cause output terminal Vout to reach the same logic level as data input terminal Vin1 or Vin2 or Vinx of logic section 12 of FIGS. 1 and 2. Correspondingly, output terminal Vouti is the complement of Vin1, or Vin2 or Vinx.

The operation of bipolar latch section 14 is as follows. Assuming that output terminals 32 and 34 are a "1" and a "0", respectively, at the time Vcki switches from a "0" to a "1" and Vck switches from a "1" to a "0". This causes the base of T11 to be a "1" and the base of T10 to be a "0". T10 and T11 both function as emitter followers and thus the emitters thereof are set in potential to one Vbe (base-emitter) voltage drop below their respective base voltage. Accordingly, the base of T13, which is coupled to the emitter of T11, is higher in voltage than the base of T12 which is coupled to the emitter of T10. This causes current to flow from Vcc through resistor 52, through T13, transistor 18, resistor 20 and into Vss. This maintains the voltage on terminal 34 at "0" even though logic section 10 of FIGS. 1 and 2 is disabled at this time and thus does not cause terminal 34 to be held at a "0". This "0" at the base of T10 causes the emitter of T10 and thus the base of T12 to be held at a less positive voltage than the base of T13. This keeps T13 enabled and conducting which effectively keeps the voltage of the base of T12 lower than that of the base of T13. Accordingly, the output voltage level at Vout is actively held at a "0" level. Correspondingly, the high level or the base of T11 is downshifted by the Vbe of T11 and is maintained at a "1" level.

If the voltages at terminals 32 and 34 are "0" and "1", respectively, the Vout="1" and Vouti="0".

When it is desired to allow new data to be entered into logic section 12, Vcki is switched from a "1" to a "0" and Vck switches from a "0" to a "1". As Vcki is switched from a "1" to a "0", Vck is switched from a "0" to a "1". These conditions enable logic section 12 and disable latch section 14. Typically at least no later than the point in time that Vck becomes a "1", new data input signals are applied to Vin1, Vin2 . . . .Vinx and new selection input signals are applied to Vsell, Vsel2 . . . .Vselx of FIGS. 1 and 2.

In an illustrative embodiment, Vcc= +3.6 volts, Vss=0 volts, Vee= +1.1 volts, and resistors 50, 52, 80, 82 and 20=1140 ohms, 1140 ohms, 1000 ohms, 1000 ohms, and 2130 ohms, respectively.

It is to be noted that field effect transistor 18 is switched "ON" (enabled) to start a cycle of operation of latch section 14 and is switched "OFF" (disabled) to end the cycle of latch section 14. During the time transistor 18 is enabled, the latch section "latches-up" with a response time which is determined by the bipolar transistors thereof. Accordingly, "latch-up" time is achieved at the rapid speed associated with emitter coupled bipolar circuitry. This insures that latch section 14 can respond in pico-seconds.

The embodiments described herein are intended to be illustrative of the general principles of the invention. Various modifications employing these principles may be devised by those skilled in the art without departing from the spirit of the invention.

What is claimed is:

1. In combination:
   a first resistive element;
   a logic section comprising bipolar transistors;
   a first field effect transistor having a gate and first and second outputs, the first output of the field effect transistor being coupled to at least one of the bipolar transistors of the logic section;
   the first field effect transistor, when fully turned on, being adapted to selectively enable the logic section so as to allow current flow through at least one of the bipolar transistors of the logic section and being adapted to selectively disable the logic section so as to cut off current flow through the transistors of the logic section;
   a latch section comprising bipolar transistors;
   a second field effect transistor having a gate and first and second outputs, the first output of the second field effect transistor being coupled to at least one of the bipolar transistors of the latch section;
   the second field effect transistor being adapted to selectively disable the latch section while the logic section is enabled and, when fully turned on, to enable conduction through at least one of the bipolar transistors of the latch section when the logic section is disabled;
   an output of the logic section being coupled to an input of the latch section; and
   the second outputs of the first and second field effect transistors being coupled to the first resistive element, said first resistive element in combination with the bipolar transistors of the logic section, when enabled, and the bipolar transistors of the latch section, when enabled, functioning as a relatively constant current source.

2. The combination of claim 1 wherein:
   the logic section comprises second and third resistive elements;
   the logic section comprises at least three pairs of emitter coupled n-p-n transistors with emitters of the first pair being coupled to a collector of a first transistor of the third pair, with emitters of the second pair being coupled to a collector of a second transistor of the third pair, and with emitters of the third pair being coupled to the first output of the first field effect transistor;
   a first transistor of the first pair having a collector thereof coupled to the second resistive element; and
   a second transistor of the first pair having a collector thereof coupled to the third resistive element.

3. The combination of claim 2 wherein:
   the latch section comprises fourth and fifth resistive elements;
   the latch section comprises a fourth pair of emitter coupled n-p-n transistors and ninth and tenth n-p-n transistors;
   an emitter of the ninth transistor being coupled to the fourth resistive element and to a base of a first transistor of the fourth pair of transistors;
   an emitter of the tenth transistor being coupled to the fifth resistive element and to a base of a second transistor of the fourth pair of transistors;
   emitter of the fourth pair of transistors being coupled to the first output of the second field effect transistor; and
   the second output of the second field effect transistor being coupled to the second output of the first field effect transistor; and
   collectors of the first and second transistors of the fourth pair of transistors being coupled to the second resistive element and to the third resistive element, respectively.

4. The combination of claim 3 wherein the first and second field effect transistors are n-channel insulated gate field effect transistors.

5. The combination of claim 4 wherein:
   the second and third resistive elements and collectors of the ninth and tenth transistors are coupled to a first power supply terminal;
   the first resistive element is coupled to a second power supply terminal;
   the fourth and fifth resistive elements are coupled to a third power supply terminal;
   bases of the second transistors of each of the first and second pairs of transistors are coupled to a voltage reference terminal; and
   the gates of the first and second field effect transistors are coupled to a clock terminal and an inverse clock terminal, respectively.

6. Circuitry comprising:
   first, second, and third pairs of emitter coupled bipolar transistors and a field effect transistor, each of the bipolar transistors having a base, an emitter and a collector, and the field effect transistor having a gate and first and second outputs;
   first, second, and third resistive elements;
   the emitters of the first pair of transistors being coupled to the collector of the first transistor of the third pair of transistors;
   the emitters of the second pair of transistors being coupled to the collector of the second transistor of the third pair transistors;
   the emitters of the third pair of transistors being coupled to the first output of the field effect transistor;
   the bases of the first transistors of the first and second pairs of transistors being coupled to first and second input data terminals, respectively, of the circuitry;
   the bases of the first and second transistors of the third pair of transistors being coupled to first and second input selection terminals, respectively, of the circuitry;
   the gate of the FET being coupled to a clock terminal of the circuitry for turning the FET fully on during one portion of a clock cycle and turning the FET fully off during another portion of a clock cycle, the FET, when fully on, having a voltage drop between its first and second outputs which is much smaller than the voltage drop between the collector and emitter of a turned on bipolar transistor;

the collectors of the first transistors of the first and second pairs of transistors being coupled to a first output terminal of the circuitry;

the collectors of the second transistors of the first and second pairs of transistors being coupled to a second output terminal of the circuitry;

the collectors of the first transistors of the first and second pairs of transistors being coupled to the first and second resistive elements, respectively; and the second output of the FET being coupled to the third resistive element for, when the FET is turned fully on, enabling the combination of the third pair of transistors and the third resistive element to produce a relatively constant current whose amplitude is a function of a voltage applied to the bases of the third pair of transistors.

7. The circuitry of claim 6 wherein all of the bipolar transistors are n-p-n transistors and the field effect transistor is an n-channel enhancement field effect transistor.

8. The circuitry of claim 7 wherein the n-channel field effect transistor is an insulated gate field effect transistor.

9. The circuitry of claim 8 wherein:

the bases of the second transistors of each of the first and second pairs of transistors are coupled to a reference voltage terminal;

the bases of the first transistors of the first and second pairs of transistors are coupled to first and second data input terminals, respectively; and the first and second selection terminals are adapted to receive complementary signals.

10. The circuitry of claim 9 further comprising:

a fourth pair of emitter coupled n-p-n transistors each having a base, an emitter and a collector;

a ninth n-p-n transistor having a collector coupled to the emitters of the first and second transistors of the fourth pair of transistors and having an emitter coupled to the emitters of the first and second transistors of the third pair of transistors; and the base of the ninth transistor being coupled to a separate third selection terminal;

the first, second and third selection terminals being adapted such that during operation of the circuitry only one of same is enabled while the others are disabled.

11. The circuitry of claim 10 further comprising:

additional pairs of emitter coupled n-p-n transistors and an additional n-p-n transistor being associated with each additional pair of transistors, each of the transistors of the additional pair and the additional transistor having a base, an emitter, and a collector;

the emitters of each additional pair of transistors being coupled to the collector of the additional transistor associated therewith;

the emitters of each of the additional transistors being coupled to the emitters of the first and second transistors of the third pair of transistors.

12. The circuitry of claim 11 wherein:

the first and second resistive elements are coupled to a first power supply terminal; and the third resistive element is coupled to a second power supply terminal.

* * * * *